United States Patent
Kamata et al.

(10) Patent No.: US 9,030,205 B2
(45) Date of Patent: May 12, 2015

(54) ELECTRIC LEAKAGE DETECTING APPARATUS

(71) Applicant: Keihin Corporation, Tokyo (JP)

(72) Inventors: Seiji Kamata, Tochigi-ken (JP); Hidefumi Abe, Tochigi-ken (JP)

(73) Assignee: Keihin Corporation (JP)

( * ) Notice: Subject to any disclaimer, the term of this patent is extended or adjusted under 35 U.S.C. 154(b) by 399 days.

(21) Appl. No.: 13/656,009

(22) Filed: Oct. 19, 2012

(65) Prior Publication Data

US 2013/0099795 A1    Apr. 25, 2013

(30) Foreign Application Priority Data

Oct. 24, 2011    (JP) ................ 2011-233072

(51) Int. Cl.
| | |
|---|---|
| *G01R 31/14* | (2006.01) |
| *G01N 27/416* | (2006.01) |
| *H02H 3/00* | (2006.01) |
| *H02J 7/00* | (2006.01) |
| *G01R 31/36* | (2006.01) |
| *G01R 31/02* | (2006.01) |

(52) U.S. Cl.
CPC .......... *G01R 31/3658* (2013.01); *G01R 31/025* (2013.01)

(58) Field of Classification Search
USPC ........ 324/509, 434; 320/116, 117; 361/42, 45
See application file for complete search history.

(56) References Cited

U.S. PATENT DOCUMENTS

| | | | | |
|---|---|---|---|---|
| 6,320,389 | B1 * | 11/2001 | Tamesue et al. | 324/509 |
| 7,629,794 | B2 * | 12/2009 | Kamata | 324/509 |
| 8,004,284 | B2 * | 8/2011 | Kamata | 324/509 |
| 8,154,832 | B2 * | 4/2012 | Huang | 361/42 |
| 8,737,026 | B2 * | 5/2014 | Ueno et al. | 361/42 |
| 2008/0048667 | A1 * | 2/2008 | Yu et al. | 324/509 |
| 2011/0006777 | A1 * | 1/2011 | Park et al. | 324/509 |
| 2011/0156618 | A1 * | 6/2011 | Seo et al. | 318/3 |

FOREIGN PATENT DOCUMENTS

JP    2009-281986 A    12/2009

* cited by examiner

*Primary Examiner* — M'Baye Diao
(74) *Attorney, Agent, or Firm* — Cantor Colburn LLP

(57) ABSTRACT

An electric leakage detecting apparatus includes: a first voltage-dividing circuit; a second voltage-dividing circuit; a first switch which is inserted in a line connecting the first voltage-dividing circuit and the ground connection resistance; a second switch which is inserted in a line connecting the second voltage-dividing circuit and the ground connection resistance; a first voltage detecting circuit which detects an output voltage of the first voltage-dividing circuit; a second voltage detecting circuit which detects an output voltage of the second voltage-dividing circuit; and a judging circuit which judges whether the electric leakage of the high voltage battery occurs or not on the basis of the output voltage of the first voltage-dividing circuit in a case that the first switch is in ON state and the output voltage of the second voltage-dividing circuit in a case that the second switch is in ON state.

7 Claims, 8 Drawing Sheets

ELECTRIC LEAKAGE DETECTING APPARATUS

TECHNICAL FIELD

The present invention relates to an electric leakage detecting apparatus.

Priority is claimed on Japanese Patent Application No. 2011-233072, filed Oct. 24, 2011, the content of which is incorporated herein by reference.

BACKGROUND ART

As well known, vehicles such as an electric motorcar and a hybrid car include motors which are source of power and high voltage and large capacity battery which supplies electric power to the motors. The high voltage battery contains plural battery cells which are lithium ion batteries, hydrogen nickel batteries, or the like and which are series-connected.

The high voltage battery is insulated from a chassis ground for safety. Thus, it is very important to monitor the insulating state of the high voltage battery and the chassis ground. For example, the patent document 1 discloses the technique which measures the insulating state (specifically insulation resistance) of the high voltage battery and the chassis ground by using the insulated measuring circuit of a flying capacitor method.

RELATED ART DOCUMENT

Patent Document

[Patent Document 1] Japanese Unexamined Patent Application, First Publication No. 2009-281986

SUMMARY OF INVENTION

Technical Problem

According to the above-mentioned conventional technique, plural switching elements for high voltage which were expensive were necessary in order to detect the electric leakage of the high voltage battery by the circuit on the basis of the chassis ground, so that there was a problem in that cost for parts increased.

The present invention has been made in consideration of the above mentioned situations, and an object of the present invention is to provide an electric leakage detecting apparatus which can detect the electric leakage of the high voltage battery by low cost and a simple circuit structure.

Solution to Problem (1) An electric leakage detecting apparatus which detects electric leakage of a high voltage battery which includes a plurality of cell modules and is insulated from a chassis ground according to an aspect of the present invention includes: a first cell module which is any one of the plurality of cell modules and is in a positive electrode side; a second cell module which is any one of the plurality of cell modules and is in a negative electrode side as compared with the first cell module; a first voltage-dividing circuit which is parallely-connected to the first cell module; a second voltage-dividing circuit which is parallely-connected to the second cell module; a ground connection resistance whose one end is connected to the chassis ground; a first switch which is inserted in a line connecting an output end of the first voltage-dividing circuit and other end of the ground connection resistance; a second switch which is inserted in a line connecting an output end of the second voltage-dividing circuit and the other end of the ground connection resistance; a first voltage detecting circuit which detects an output voltage of the first voltage-dividing circuit; a second voltage detecting circuit which detects an output voltage of the second voltage-dividing circuit; and a judging circuit which judges whether the electric leakage of the high voltage battery occurs or not on the basis of the output voltage of the first voltage-dividing circuit which is detected by the first voltage detecting circuit in a case that the first switch is in ON state and the output voltage of the second voltage-dividing circuit which is detected by the second voltage detecting circuit in a case that the second switch is in ON state.

(2) In the electric leakage detecting apparatus according to (1), when both the output voltage of the first voltage-dividing circuit which is detected by the first voltage detecting circuit in the case that the first switch is in ON state and the output voltage of the second voltage-dividing circuit which is detected by the second voltage detecting circuit in the case that the second switch is in ON state are more than or equal to a first threshold value, the judging circuit may judge that the electric leakage occurs in the positive electrode side of the high voltage battery.

(3) In the electric leakage detecting apparatus according to (1), when both the output voltage of the first voltage-dividing circuit which is detected by the first voltage detecting circuit in the case that the first switch is in ON state and the output voltage of the second voltage-dividing circuit which is detected by the second voltage detecting circuit in the case that the second switch is in ON state are less than or equal to a second threshold value, the judging circuit may judge that the electric leakage occurs in the negative electrode side of the high voltage battery.

(4) In the electric leakage detecting apparatus according to (1), when one of the output voltage of the first voltage-dividing circuit which is detected by the first voltage detecting circuit in the case that the first switch is in ON state and the output voltage of the second voltage-dividing circuit which is detected by the second voltage detecting circuit in the case that the second switch is in ON state is more than or equal to the first threshold value and other is less than or equal to the second threshold value, the judging circuit may judge that the electric leakage occurs between the first cell module and the second cell module.

(5) In the electric leakage detecting apparatus according to (1), when the output voltage of the first voltage-dividing circuit which is detected by the first voltage detecting circuit in the case that the first switch is in ON state is equal to a voltage in a case that the first switch is in OFF state and when the output voltage of the second voltage-dividing circuit which is detected by the second voltage detecting circuit in the case that the second switch is in ON state is more than or equal to the first threshold value, the judging circuit may judge that the electric leakage occurs in the first cell module.

(6) In the electric leakage detecting apparatus according to (1), when the output voltage of the first voltage-dividing circuit which is detected by the first voltage detecting circuit in the case that the first switch is in ON state is less than or equal to the second threshold value and when the output voltage of the second voltage-dividing circuit which is detected by the second voltage detecting circuit in the case that the second switch is in ON state is equal to a voltage in a case that the second switch is in OFF state, the judging circuit may judge that the electric leakage occurs in the second cell module.

(7) The electric leakage detecting apparatus according to (1) may further comprise at least a contactor between the first cell module and the second cell module, wherein, when the contactor is in OFF state, the judging circuit may judge whether the electric leakage of the high voltage battery occurs or not on the basis of any one of the output voltage of the first voltage-dividing circuit and the output voltage of the second voltage-dividing circuit.

Advantageous Effects of Invention

According to the present invention, since the conventional switching elements for high voltage which are expensive are unnecessary and the circuit structure can also be simplified, the electric leakage detecting apparatus which can detect the electric leakage of the high voltage battery by low cost and the simple circuit structure can be provided.

DESCRIPTION OF EMBODIMENTS

An embodiment of the present invention will be described below with reference to the drawings.

Figure 1:
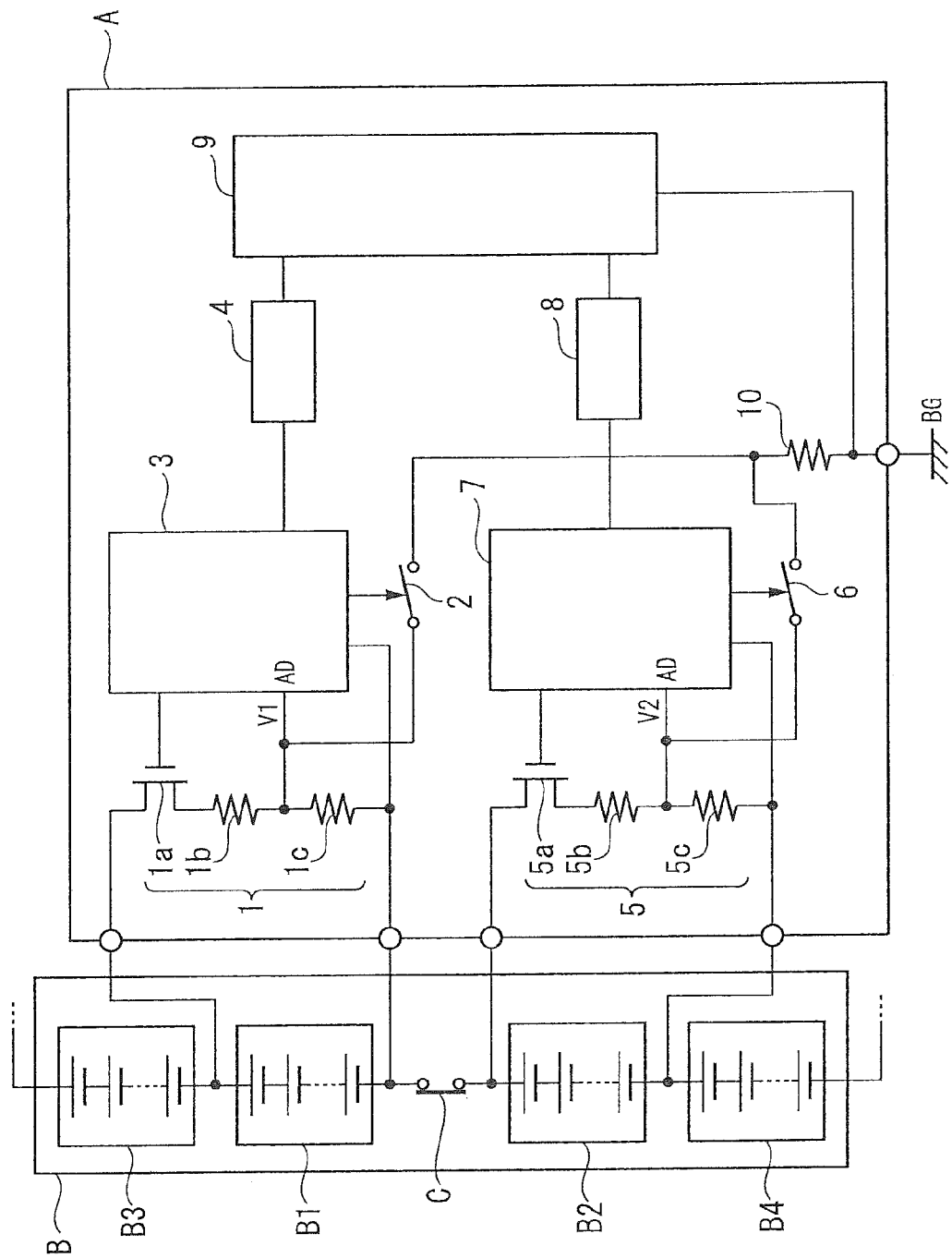
FIG. 1 is a schematically structural drawing of an electric leakage detecting apparatus A according to an aspect of the present invention.

FIG. 1 is a schematically structural drawing of an electric leakage detecting apparatus A according to the embodiment. The electric leakage detecting apparatus A detects electric leakage of a high voltage battery B for motor drive which is insulated from a chassis ground BG. As shown in FIG. 1, the electric leakage detecting apparatus A according to the embodiment includes a first voltage-dividing circuit 1, a first switch 2, a first microcomputer 3 at high-voltage side, a first insulating element 4, a second voltage-dividing circuit 5, a second switch 6, a second microcomputer 7 at high-voltage side, a second insulating element 8, a microcomputer at low-voltage side 9, and a ground connection resistance 10 whose one end is connected to the chassis ground BG.

In addition, the high voltage battery B includes four cell modules B1, B2, B3, and B4 which contain series-connected plural battery cells respectively and a contactor C. In the four cell modules B1, B2, B3, and B4, the cell module B1 which is in a positive electrode side and the cell module B2 which is in a negative electrode side are series-connected through the contactor C. Hereinafter, for convenience, the cell module B1 is referred as first cell module B1 and the cell module B2 is referred as second cell module B2. Moreover, the cell module B3 which is located in the most positive electrode side is directly series-connected to the first cell module B1. The cell module B4 which is located in the most negative electrode side is directly series-connected to the second cell module B2.

The first voltage-dividing circuit 1 is parallely-connected to the first cell module B1. The first voltage-dividing circuit 1 includes a first transistor 1a and two partial resistances 1b and 1c. The first transistor 1a is, for example, a MOS-FET which is an n-channel-type. Moreover, in regard to the first transistor 1a, a drain terminal is connected to a positive electrode terminal of the first cell module B1, a source terminal is connected to one end of the partial resistance 1b, and a gate terminal is connected to the first microcomputer 3 at high-voltage side.

In regard to the partial resistance 1b, the end is connected to the source terminal of the first transistor 1a, and the other end is connected to one end of the partial resistance 1c and an AD input port of the first microcomputer 3 at high-voltage side. In regard to the partial resistance 1c, the end is connected to the other end of the partial resistance 1b and the AD input port of the first microcomputer 3 at high-voltage side, and the other end is connected to a neutral potential point of the high voltage battery B (a negative electrode terminal of the first cell module B1) and a ground terminal of the first microcomputer 3 at high-voltage side.

The first switch 2 is a switching element (for example, Photo-MOS relay and the like) which is inserted in the line connecting the end of the partial resistance 1b (an output end of the first voltage-dividing circuit 1) and the other end of the ground connection resistance 10 (the end opposite to the end connected to the chassis ground BG). The first switch 2 changes to ON state or OFF state depending on a control signal which is inputted from the first microcomputer 3 at high-voltage side.

The first microcomputer 3 at high-voltage side is connected to the microcomputer 9 at low-voltage side through the first insulating element 4 so as to be communicable. The first microcomputer 3 at high-voltage side has a function to control ON or OFF state of the first transistor 1a and the first switch 2 in response to a request of the microcomputer 9 at low-voltage side. Moreover, the first microcomputer 3 at high-voltage side has a function to perform A/D conversion from an input voltage V1 of AD input port to digital data and has a function to output the digital data of the input voltage V1 to the microcomputer 9 at low-voltage side. In addition, the first microcomputer 3 at high-voltage side acts as a first voltage detecting circuit which detects an output voltage of the first voltage-dividing circuit 1.

The first insulating element 4 is an insulating element (for example, photo-coupler and the like) which is inserted in the communication line connecting the first microcomputer 3 at high-voltage side and the microcomputer 9 at low-voltage side. By providing the first insulating element 4, the inside of the electric leakage detecting apparatus A is electrically divided into the high-voltage side and the low-voltage side.

The second voltage-dividing circuit 5 is parallely-connected to the second cell module B2. The second voltage-dividing circuit 5 includes a second transistor 5a and two partial resistances 5b and 5c. The second transistor 5a is, for example, the MOS-FET which is the n-channel-type. Moreover, in regard to the second transistor 5a, a drain terminal is connected to the neutral potential point of the high voltage battery B (a positive electrode terminal of the second cell module B2), a source terminal is connected to one end of the partial resistance 5b, and a gate terminal is connected to the second microcomputer 7 at high-voltage side.

In regard to the partial resistance 5b, the end is connected to the source terminal of the second transistor 5a, and the other end is connected to one end of the partial resistance 5c and an AD input port of the second microcomputer 7 at high-voltage side. In regard to the partial resistance 5c, the end is connected to the other end of the partial resistance 5b and the AD input port of the second microcomputer 7 at high-voltage side, and the other end is connected to a negative electrode terminal of the second cell module B2 and a ground terminal of the second microcomputer 7 at high-voltage side.

The second switch 6 is the switching element (for example, Photo-MOS relay and the like) which is inserted in the line connecting the end of the partial resistance 5b (an output end of the second voltage-dividing circuit 5) and the end of the ground connection resistance 10 (the end opposite to the end connected to the chassis ground BG). The second switch 6 changes to ON state or OFF state depending on a control signal which is inputted from the second microcomputer 7 at high-voltage side.

The second microcomputer 7 at high-voltage side is connected to the microcomputer 9 at low-voltage side through the second insulating element 8 so as to be communicable. The second microcomputer 7 at high-voltage side has a function to control ON or OFF state of the second transistor 5a and the second switch 6 in response to a request of the microcomputer 9 at low-voltage side. Moreover, the second microcomputer 7 at high-voltage side has a function to perform A/D conversion from an input voltage V2 of AD input port to digital data and has a function to output the digital data of the input voltage V2 to the microcomputer 9 at low-voltage side. In addition, the second microcomputer 7 at high-voltage side acts as a second voltage detecting circuit which detects an output voltage of the second voltage-dividing circuit 5.

The second insulating element 8 is the insulating element (for example, photo-coupler and the like) which is inserted in the communication line connecting the second microcomputer 7 at high-voltage side and the microcomputer 9 at low-voltage side. By providing the second insulating element 8, the inside of the electric leakage detecting apparatus A is electrically divided into the high-voltage side and the low-voltage side.

The microcomputer 9 at low-voltage side is connected to the first microcomputer 3 at high-voltage side and the second microcomputer 7 at high-voltage side through the first insulating element 4 and the second insulating element 8 so as to be communicable. The microcomputer 9 at low-voltage side requires the first microcomputer 3 at high-voltage side to control ON or OFF state of the first transistor 1a and the first switch 2 when timing for electric leakage detection comes. In the same way, the microcomputer 9 at low-voltage side requires the second microcomputer 7 at high-voltage side to control ON or OFF state of the second transistor 5a and the second switch 6 when the timing for the electric leakage detection comes.

In addition, the microcomputer 9 at low-voltage side acts as a judging circuit which judges whether the electric leakage of the high voltage battery B occurs or not on the basis of the digital data of the input voltage V1 (the output voltage of the first voltage-dividing circuit 1) which is outputted from the first microcomputer 3 at high-voltage side when the first switch 2 is ON and the digital data of the input voltage V2 (the output voltage of the second voltage-dividing circuit 5) which is outputted from the second microcomputer 7 at high-voltage side when the second switch 6 is ON.

Next, operation of the electric leakage detecting apparatus A which is composed as mentioned above is described in detail.

<The Case where the Electric Leakage Occurs in the Positive Electrode Side of the High Voltage Battery B>

Figure 2:
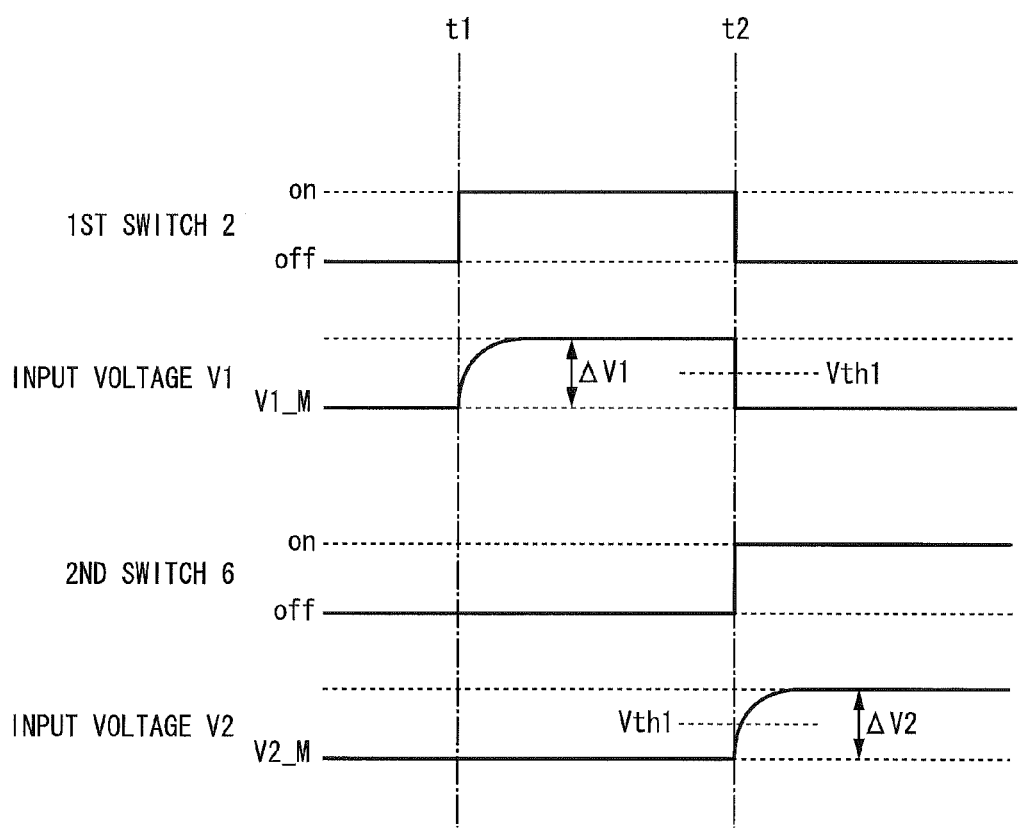
FIG. 2 is a timing chart which shows actions of electric leakage detection in a case that electric leakage occurs at a positive electrode side of high voltage battery B.

At first, actions of the electric leakage detection when the electric leakage occurs in the positive electrode side of the high voltage battery B are described. FIG. 2 is a timing chart which shows temporal correspondence between the ON or OFF state of the first switch 2, the input voltage V1 of the first microcomputer 3 at high-voltage side, the ON or OFF state of the second switch 6, and the input voltage V2 of the second microcomputer 7 at high-voltage side in the case that the electric leakage occurs in the positive electrode side of the high voltage battery B.

As shown in FIG. 2, in an initial state, it is assumed that both the first switch 2 and the second switch 6 are in the OFF state (in addition, it is assumed that both the first transistor 1a and second transistor 5a are controlled to the ON state). At the time, the input voltage V1 of the first microcomputer 3 at high-voltage side (the output voltage of the first voltage-dividing circuit 1) becomes a value (V1_M) obtained by resistantly dividing the voltage across terminals of the first cell module B1 by the partial resistance 1b and 1c. In the same way, the input voltage V2 of the second microcomputer 7 at high-voltage side (the output voltage of the second voltage-dividing circuit 5) becomes a value (V2_M) obtained by resistantly dividing the voltage across terminals of the second cell module B2 by the partial resistance 5b and 5c.

Here, at time t1, it is assumed that the first microcomputer 3 at high-voltage side changes the first switch 2 to the ON state in response to the request of the microcomputer 9 at low-voltage side. If the electric leakage does not occur in the high voltage battery B at the time, the input voltage V1 of the first microcomputer 3 at high-voltage side should be equal to the voltage-divided value V1_M.

Figure 3A:
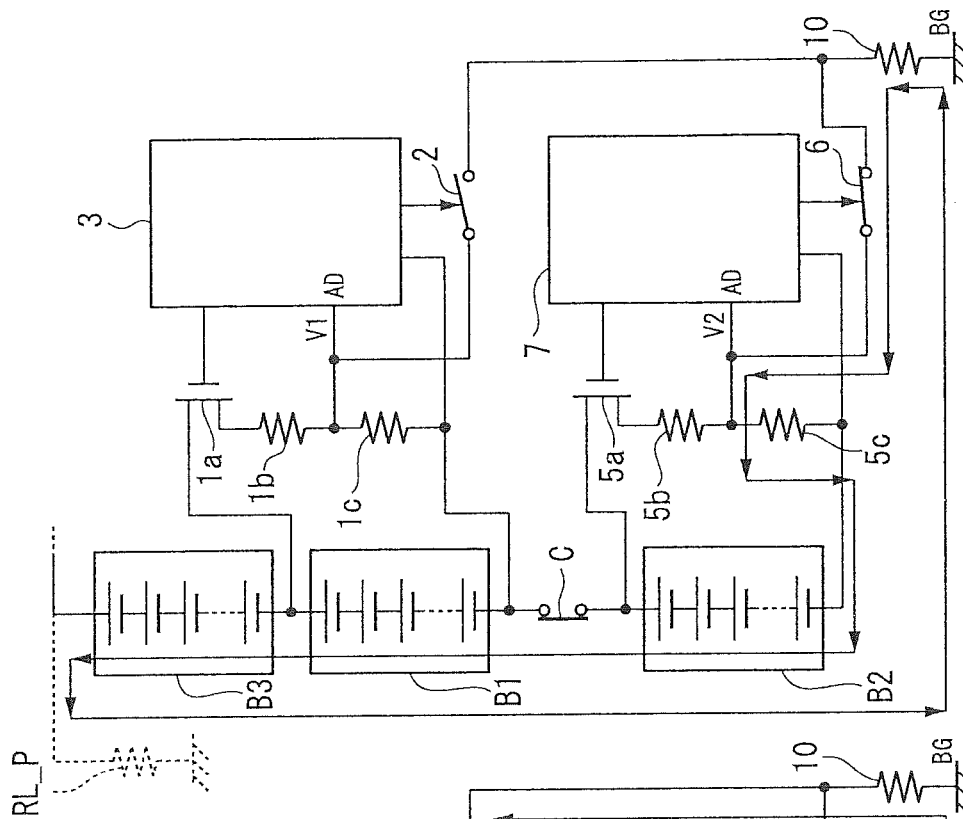
FIG. 3A is a drawing which shows a current path when first switch 2 turns on, in a case that electric leakage occurs at a positive electrode side of high voltage battery B.

However, as shown in FIG. 3A, in the case that the electric leakage occurs in the positive electrode side of the high voltage battery B (a positive electrode terminal of the cell module B3), when the first switch 2 is in the ON state, electric current flows in the path which is an order of the positive electrode terminal of the cell module B3, an electrical leakage resistance RL_P, the chassis ground BG, the ground connection resistance 10, the first switch 2, the partial resistance 1c, the first cell module B1, and a negative electrode terminal of the cell module B3. As a result, the input voltage V1 of the first microcomputer 3 at high-voltage side becomes higher ΔV1 than the voltage-divided value V1_M (refer to FIG. 2).

Consecutively, at time t2, it is assumed that the first microcomputer 3 at high-voltage side changes the first switch 2 to the OFF state in response to the request of the microcomputer 9 at low-voltage side, and that the second microcomputer 7 at high-voltage side changes the second switch 6 to the ON state in response to the request of the microcomputer 9 at low-voltage side. If the electric leakage does not occur in the high voltage battery B at the time, the input voltage V2 of the second microcomputer 7 at high-voltage side should be equal to the voltage-divided value V2_M.

Figure 3B:
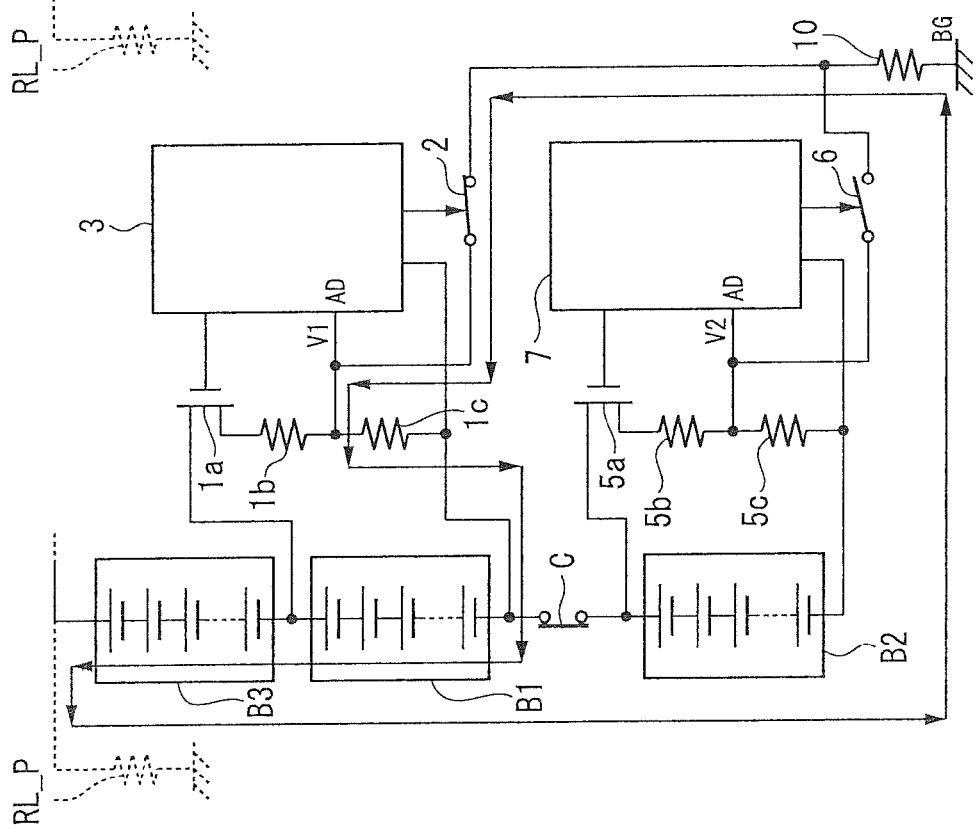
FIG. 3B is a drawing which shows a current path when second switch 6 turns on, in a case that electric leakage occurs at a positive electrode side of high voltage battery B.

However, as shown in FIG. 3B, in the case that the electric leakage occurs in the positive electrode side of the high voltage battery B, when the second switch 6 is in the ON state, electric current flows in the path which is an order of the positive electrode terminal of the cell module B3, the electrical leakage resistance RL_P, the chassis ground BG, the ground connection resistance 10, the second switch 6, the partial resistance 5c, the second cell module B2, the contactor C, the first cell module B1, and the negative electrode terminal of the cell module B3. As a result, the input voltage V2 of the second microcomputer 7 at high-voltage side becomes higher ΔV2 than the voltage-divided value V2_M (refer to FIG. 2).

Namely, when both the digital data of the input voltage V1 which is outputted from the first microcomputer 3 at high-voltage side in the case that the first switch 2 is ON and the digital data of the input voltage V2 which is outputted from the second microcomputer 7 at high-voltage side in the case that the second switch 6 is ON are more than or equal to a first threshold value Vth1, the microcomputer 9 at low-voltage side judges that the electric leakage occurs in the positive electrode side of the high voltage battery B. In addition, the first threshold value Vth1 is set to higher than the voltage-divided value V1_M and V2_M (refer to FIG. 2).

<The Case where the Electric Leakage Occurs in the Negative Electrode Side of the High Voltage Battery B>

Figure 4:
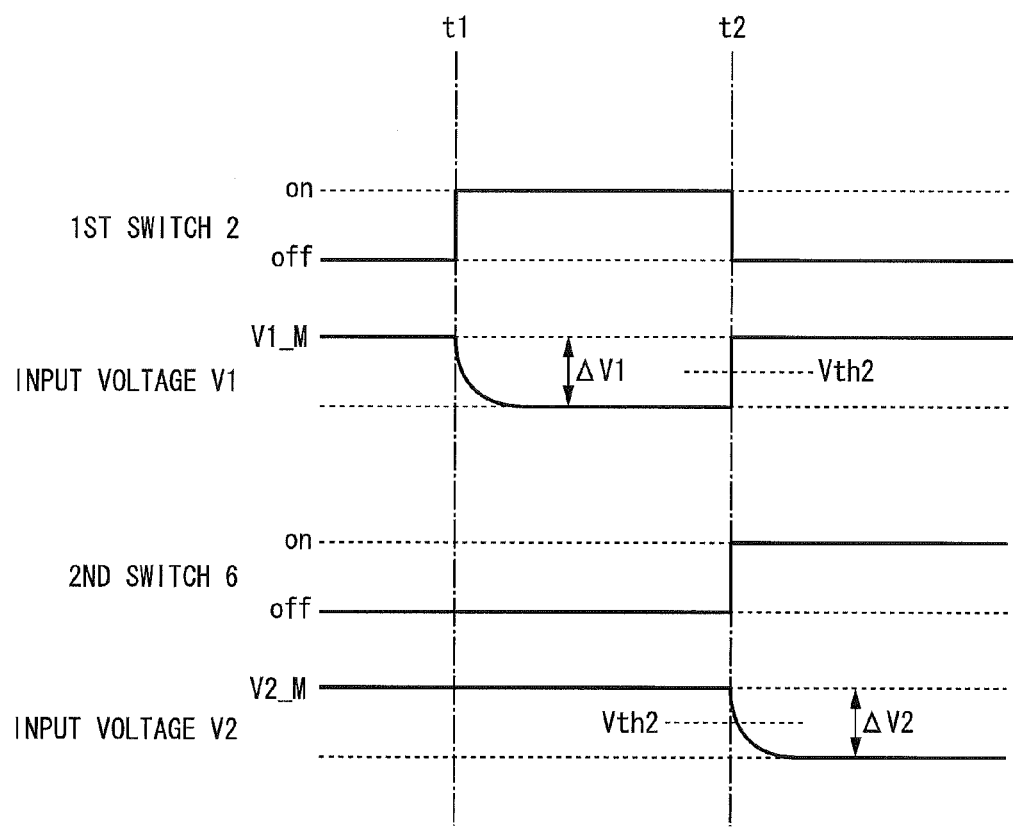
FIG. 4 is a timing chart which shows actions of electric leakage detection in a case that electric leakage occurs at a negative electrode side of high voltage battery B.

Next, actions of the electric leakage detection when the electric leakage occurs in the negative electrode side of the high voltage battery B are described. FIG. 4 is a timing chart which shows temporal correspondence between the ON or OFF state of the first switch 2, the input voltage V1 of the first microcomputer 3 at high-voltage side, the ON or OFF state of the second switch 6, and the input voltage V2 of the second microcomputer 7 at high-voltage side in the case that the electric leakage occurs in the negative electrode side of the high voltage battery B.

As shown in FIG. 4, in the initial state, it is assumed that both the first switch 2 and the second switch 6 are in the OFF state (in addition, it is assumed that both the first transistor 1a and second transistor 5a are controlled to the ON state). At the time, the input voltage V1 of the first microcomputer 3 at high-voltage side becomes the value (V1_M) obtained by resistantly dividing the voltage across terminals of the first cell module B1 by the partial resistance 1b and 1c. In the same way, the input voltage V2 of the second microcomputer 7 at high-voltage side becomes the value (V2_M) obtained by resistantly dividing the voltage across terminals of the second cell module B2 by the partial resistance 5b and 5c.

Here, at time t1, it is assumed that the first microcomputer 3 at high-voltage side changes the first switch 2 to the ON state in response to the request of the microcomputer 9 at low-voltage side. If the electric leakage does not occur in the high voltage battery B at the time, the input voltage V1 of the first microcomputer 3 at high-voltage side should be equal to the voltage-divided value V1_M.

Figure 5A:
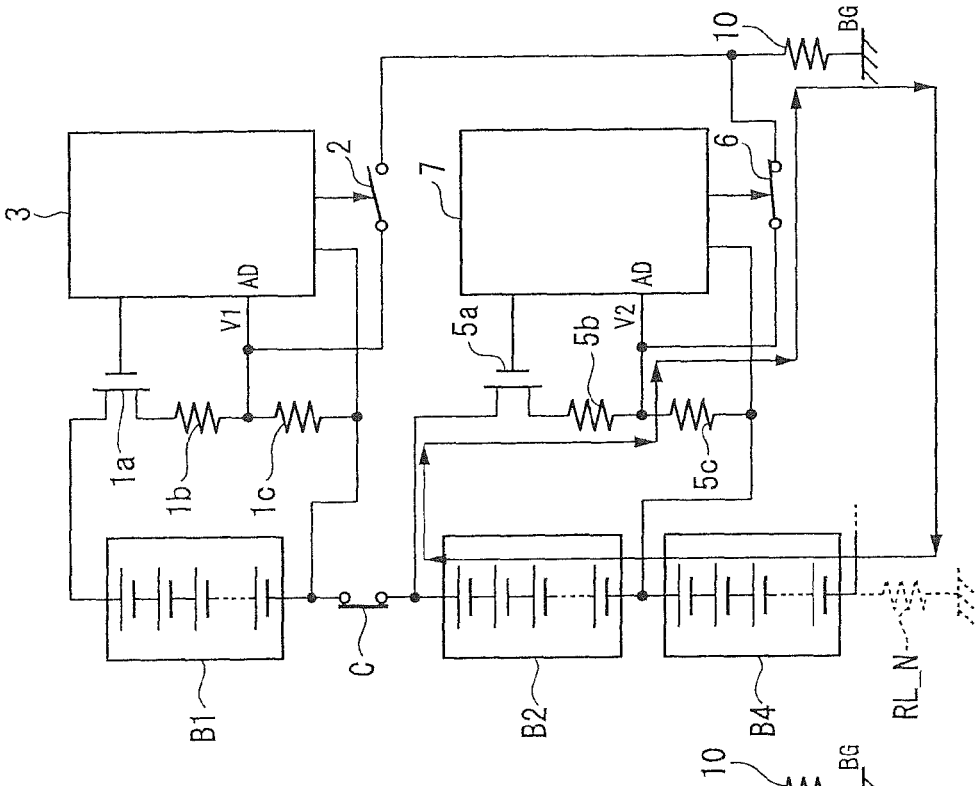
FIG. 5A is a drawing which shows a current path when first switch 2 turns on, in a case that electric leakage occurs at a negative electrode side of high voltage battery B.

However, as shown in FIG. 5A, in the case that the electric leakage occurs in the negative electrode side of the high voltage battery B (a negative electrode terminal of the cell module B4), when the first switch 2 is in the ON state, electric current flows in the path which is an order of the positive electrode terminal of the first cell module B1, the first transistor 1a, the partial resistance 1b, the first switch 2, the ground connection resistance 10, the chassis ground BG, an electrical leakage resistance RL_N, the cell module B4, the second cell module B2, the contactor C, and the negative electrode terminal of the first cell module B1. As a result, the input voltage V1 of the first microcomputer 3 at high-voltage side becomes lower ΔV1 than the voltage-divided value V1_M (refer to FIG. 4).

Consecutively, at time t2, it is assumed that the first microcomputer 3 at high-voltage side changes the first switch 2 to the OFF state in response to the request of the microcomputer 9 at low-voltage side, and that the second microcomputer 7 at high-voltage side changes the second switch 6 to the ON state in response to the request of the microcomputer 9 at low-voltage side. If the electric leakage does not occur in the high voltage battery B at the time, the input voltage V2 of the second microcomputer 7 at high-voltage side should be equal to the voltage-divided value V2_M.

Figure 5B:
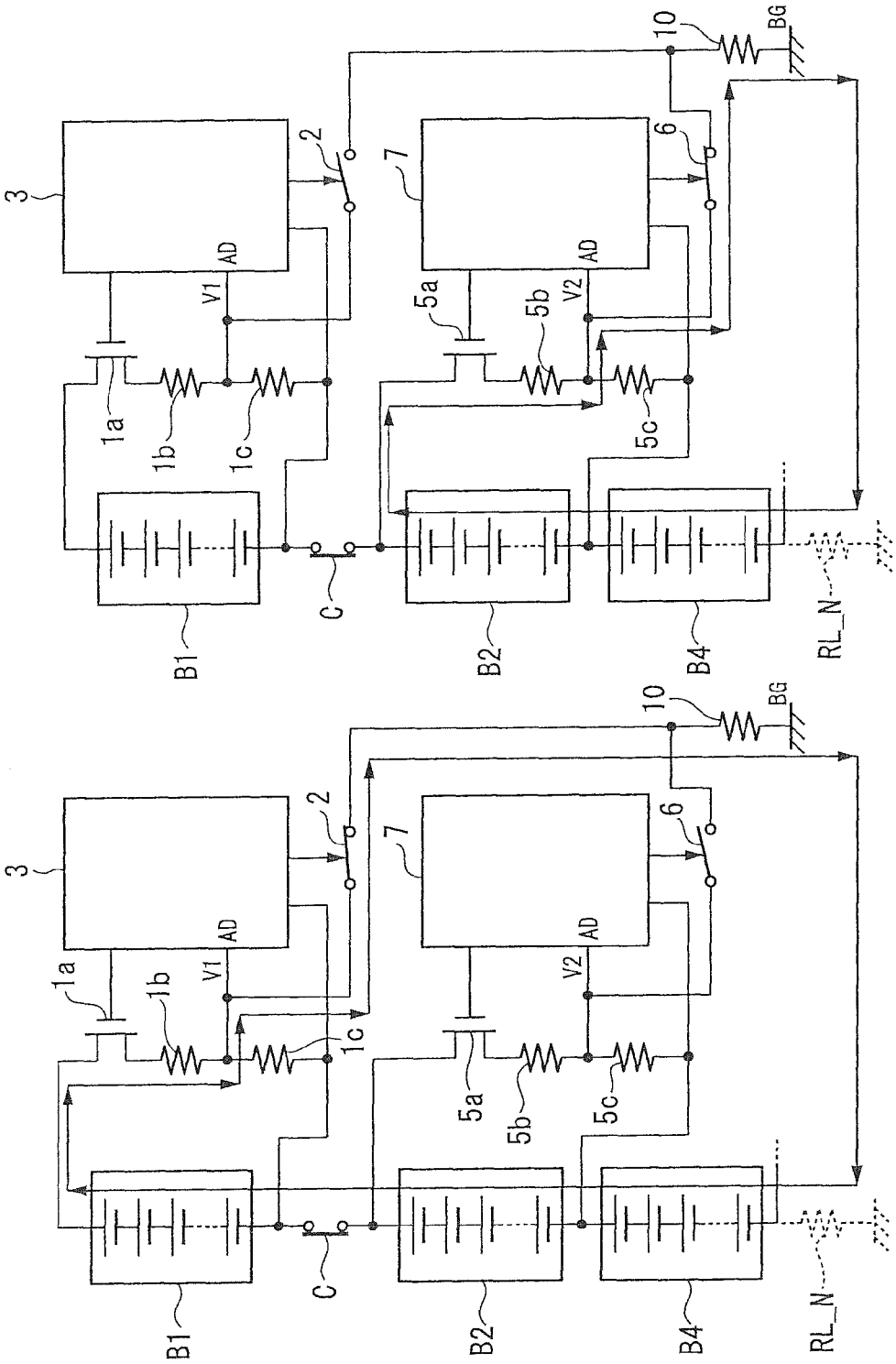
FIG. 5B is a drawing which shows a current path when second switch 6 turns on, in a case that electric leakage occurs at a negative electrode side of high voltage battery B.

However, as shown in FIG. 5B, in the case that the electric leakage occurs in the negative electrode side of the high voltage battery B, when the second switch 6 is in the ON state, electric current flows in the path which is an order of the positive electrode terminal of the second cell module B2, the second transistor 5a, the partial resistance 5b, the second switch 6, the ground connection resistance 10, the chassis ground BG, the electrical leakage resistance RL_N, the cell module B4, and the negative electrode terminal of the second cell module B2. As a result, the input voltage V2 of the second microcomputer 7 at high-voltage side becomes lower ΔV2 than the voltage-divided value V2_M (refer to FIG. 4).

Namely, when both the digital data of the input voltage V1 which is outputted from the first microcomputer 3 at high-voltage side in the case that the first switch 2 is ON and the digital data of the input voltage V2 which is outputted from the second microcomputer 7 at high-voltage side in the case that the second switch 6 is ON are less than or equal to a second threshold value Vth2, the microcomputer 9 at low-voltage side judges that the electric leakage occurs in the negative electrode side of the high voltage battery B. In addition, the second threshold value Vth2 is set to less than the voltage-divided value V1_M and V2_M (refer to FIG. 4).

<The Case where the Electric Leakage Occurs Between the First Cell Module B1 and the Second Cell Module B2>

Figure 6:
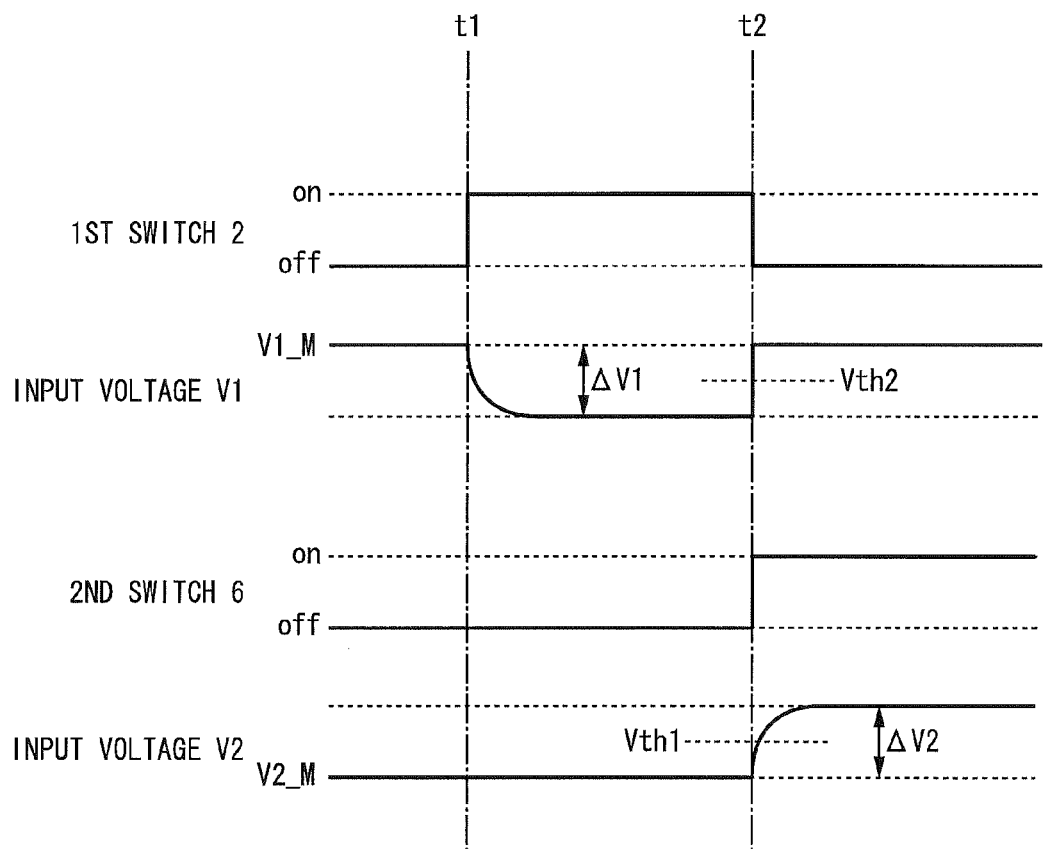
FIG. 6 is a timing chart which shows actions of electric leakage detection in a case that electric leakage occurs at a contactor C of high voltage battery B.

Next, actions of the electric leakage detection when the electric leakage occurs between the first cell module B1 and the second cell module B2 are described. FIG. 6 is a timing chart which shows temporal correspondence between the ON or OFF state of the first switch 2, the input voltage V1 of the first microcomputer 3 at high-voltage side, the ON or OFF state of the second switch 6, and the input voltage V2 of the second microcomputer 7 at high-voltage side in the case that the electric leakage occurs between the first cell module B1 and the second cell module B2.

As shown in FIG. 6, in the initial state, it is assumed that both the first switch 2 and the second switch 6 are in the OFF state (in addition, it is assumed that both the first transistor 1a and second transistor 5a are controlled to the ON state). At the time, the input voltage V1 of the first microcomputer 3 at high-voltage side becomes the value (V1_M) obtained by resistantly dividing the voltage across terminals of the first cell module B1 by the partial resistance 1b and 1c. In the same way, the input voltage V2 of the second microcomputer 7 at high-voltage side becomes the value (V2_M) obtained by resistantly dividing the voltage across terminals of the second cell module B2 by the partial resistance 5b and 5c.

Here, at time t1, it is assumed that the first microcomputer 3 at high-voltage side changes the first switch 2 to the ON state in response to the request of the microcomputer 9 at low-voltage side. If the electric leakage does not occur in the high voltage battery B at the time, the input voltage V1 of the first microcomputer 3 at high-voltage side should be equal to the voltage-divided value V1_M.

Figures 7A, 7B:
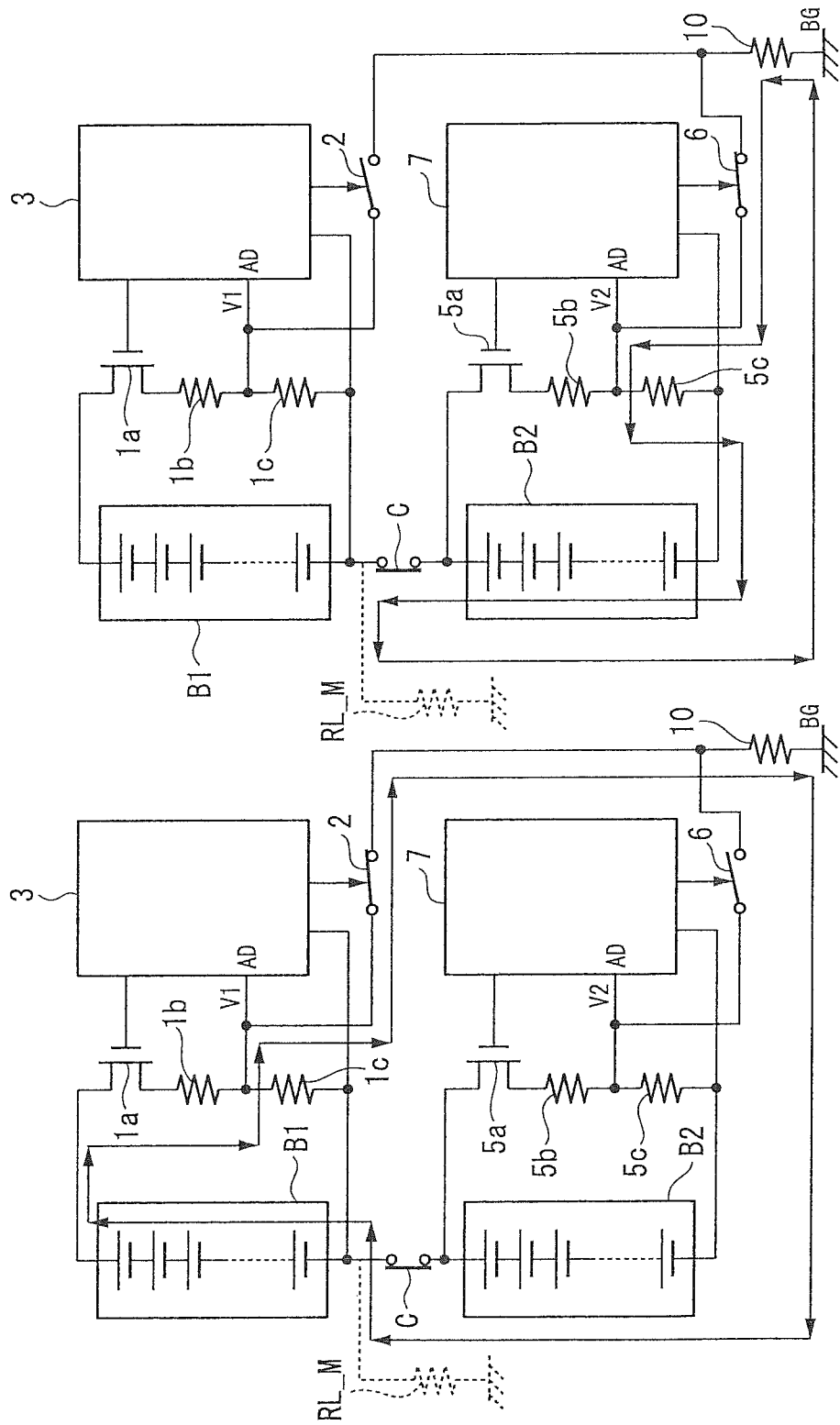
FIG. 7A is a drawing which shows a current path when first switch 2 turns on, in a case that electric leakage occurs at a contactor C of high voltage battery B.
FIG. 7B is a drawing which shows a current path when second switch 6 turns on, in a case that electric leakage occurs at a contactor C of high voltage battery B.

However, as shown in FIG. 7A, in the case that the electric leakage occurs between the first cell module B1 and the second cell module B2, when the first switch 2 is in the ON state, electric current flows in the path which is an order of the positive electrode terminal of the first cell module B1, the first transistor 1a, the partial resistance 1b, the first switch 2, the ground connection resistance 10, the chassis ground BG, an electrical leakage resistance RL_M, and the negative electrode terminal of the first cell module B1. As a result, the input voltage V1 of the first microcomputer 3 at high-voltage side becomes lower ΔV1 than the voltage-divided value V1_M (refer to FIG. 6).

Consecutively, at time t2, it is assumed that the first microcomputer 3 at high-voltage side changes the first switch 2 to the OFF state in response to the request of the microcomputer 9 at low-voltage side, and that the second microcomputer 7 at high-voltage side changes the second switch 6 to the ON state in response to the request of the microcomputer 9 at low-voltage side. If the electric leakage does not occur between the first cell module B1 and the second cell module B2 at the time, the input voltage V2 of the second microcomputer 7 at high-voltage side should be equal to the voltage-divided value V2_M.

However, as shown in FIG. 7B, in the case that the electric leakage occurs between the first cell module B1 and the second cell module B2, when the second switch 6 is in the ON state, electric current flows in the path which is an order of the positive electrode terminal of the second cell module B2, the contactor C, the electrical leakage resistance RL_M, the chassis ground BG, the ground connection resistance 10, the second switch 6, the partial resistance 5c, and the negative electrode terminal of the second cell module B2. As a result, the input voltage V2 of the second microcomputer 7 at high-voltage side becomes higher ΔV2 than the voltage-divided value V2_M (refer to FIG. 6).

Namely, when one of the digital data of the input voltage V1 which is outputted from the first microcomputer 3 at high-voltage side in the case that the first switch 2 is ON and the digital data of the input voltage V2 which is outputted from the second microcomputer 7 at high-voltage side in the case that the second switch 6 is ON is more than or equal to the first threshold value Vth1 and the other is less than or equal to the second threshold value Vth2, the microcomputer 9 at low-voltage side judges that the electric leakage occurs between the first cell module B1 and the second cell module B2.

<The Case where the Electric Leakage Occurs in the First Cell Module B1>

Next, actions of the electric leakage detection when the electric leakage occurs in the first cell module B1 are described. As mentioned above, when the first microcomputer 3 at high-voltage side changes the first switch 2 to the ON state in response to the request of the microcomputer 9 at low-voltage side, the input voltage V1 of the first microcomputer 3 at high-voltage side should be equal to the voltage-divided value V1_M, if the electric leakage does not occur in the high voltage battery B.

Figure 8A:
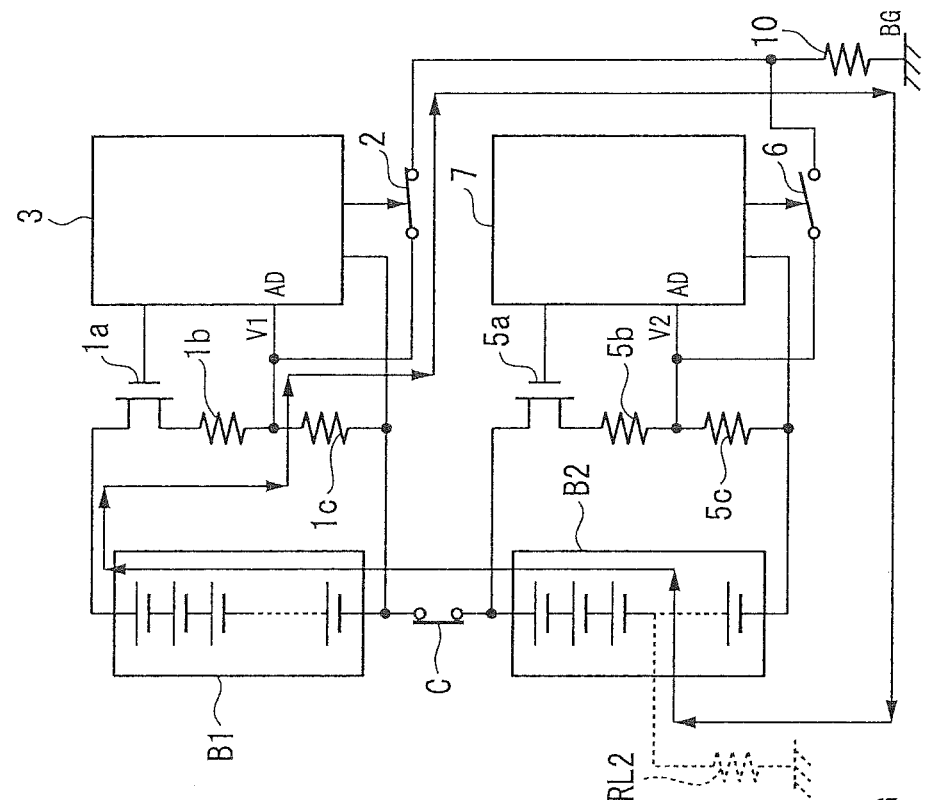
FIG. 8A is a drawing which shows a current path when second switch 6 turns on, in a case that electric leakage occurs at a first cell module B1.

However, as shown in FIG. 8A, in the case that the electric leakage occurs in the first cell module B1 and that an electric leakage voltage of the first cell module B1 (the voltage across terminals of an electrical leakage resistance RL1) becomes equal to the output voltage of the first voltage-dividing circuit 1 (the input voltage V1), electric current does not flow through the first switch 2 even when the first switch 2 is in the ON state. As a result, the input voltage V1 of the first microcomputer 3 at high-voltage side does not change (the voltage-divided value V1_M does not change when first switch 2 turns on).

On the other hand, as shown in FIG. 8A, in the case that the electric leakage occurs in the first cell module B1 and that the second switch 6 is in the ON state, electric current flows in the path which is an order of an electric leakage point of the first cell module B1, the electrical leakage resistance RL1, the chassis ground BG, the ground connection resistance 10, the second switch 6, the partial resistance 5c, the negative electrode terminal of the second cell module B2, the contactor C, and the negative electrode terminal of the first cell module B1. As a result, the input voltage V2 of the second microcomputer 7 at high-voltage side becomes higher ΔV2 than the voltage-divided value V2_M.

Namely, when the digital data of the input voltage V1 which is outputted from the first microcomputer 3 at high-voltage side in the case that the first switch 2 is ON is equal to the voltage in the case that the first switch 2 is OFF (the voltage-divided value V1_M), and when the digital data of the input voltage V2 which is outputted from the second microcomputer 7 at high-voltage side in the case that the second switch 6 is ON is more than or equal to the first threshold value Vth1, the microcomputer 9 at low-voltage side judges that the electric leakage occurs in the first cell module B1.

<The Case where the Electric Leakage Occurs in the Second Cell Module B2>

Next, actions of the electric leakage detection when the electric leakage occurs in the second cell module B2 are described. As mentioned above, when the second microcomputer 7 at high-voltage side changes the second switch 6 to the ON state in response to the request of the microcomputer 9 at low-voltage side, the input voltage V2 of the second microcomputer 7 at high-voltage side should be equal to the voltage-divided value V2_M, if the electric leakage does not occur in the high voltage battery B.

Figure 8B:
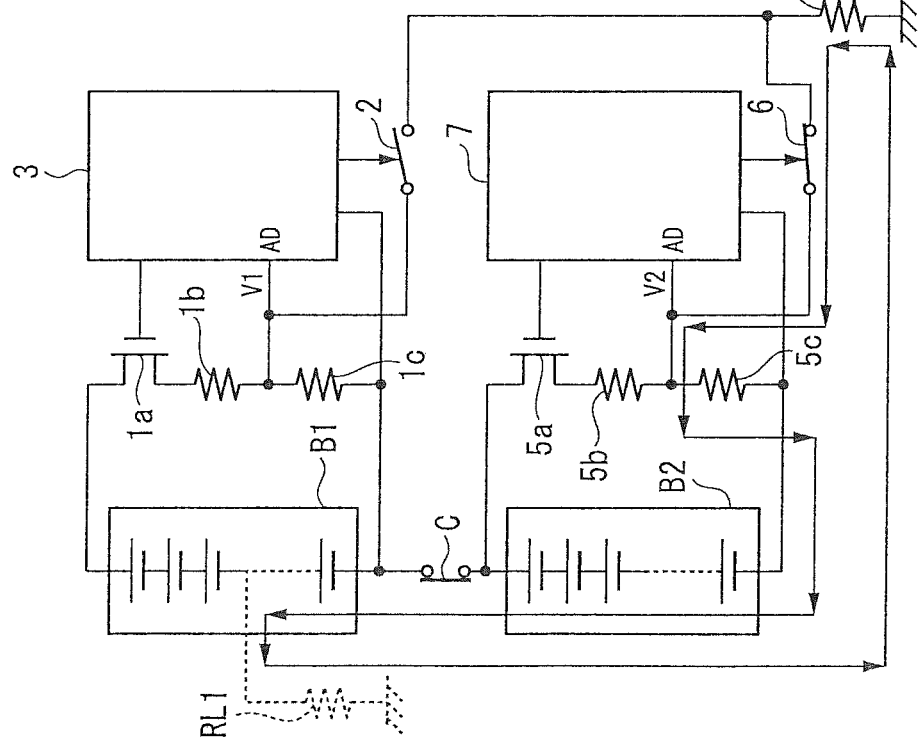
FIG. 8B is a drawing which shows a current path when first switch 2 turns on, in a case that electric leakage occurs at a second cell module B2.

However, as shown in FIG. 8B, in the case that the electric leakage occurs in the second cell module B2 and that an electric leakage voltage of the second cell module B2 (the voltage across terminals of an electrical leakage resistance RL2) becomes equal to the output voltage of the second voltage-dividing circuit 5 (the input voltage V2), electric current does not flow through the second switch 6 even when the second switch 6 is in the ON state. As a result, the input voltage V2 of the second microcomputer 7 at high-voltage side does not change (the voltage-divided value V2_M does not change when second switch 6 turns on).

On the other hand, as shown in FIG. 8B, in the case that the electric leakage occurs in the second cell module B2 and that the first switch 2 is in the ON state, electric current flows in the path which is an order of the positive electrode terminal of the second cell module B2, the contactor C, the first cell module B1, the first transistor 1a, the partial resistance 1b, the first switch 2, the ground connection resistance 10, the chassis ground BG, the electrical leakage resistance RL2, and an electric leakage point of the second cell module B2. As a result, the input voltage V1 of the first microcomputer 3 at high-voltage side becomes lower ΔV1 than the voltage-divided value V1_M.

Namely, when the digital data of the input voltage V1 which is outputted from the first microcomputer 3 at high-voltage side in the case that the first switch 2 is ON is less than or equal to the second threshold value Vth2, and when the digital data of the input voltage V2 which is outputted from the second microcomputer 7 at high-voltage side in the case that the second switch 6 is ON is equal to the voltage in the case that the second switch 6 is OFF (the voltage-divided value V2_M), the microcomputer 9 at low-voltage side judges that the electric leakage occurs in the second cell module B2.

<The Case where the Electric Leakage Occurs in the High Voltage Battery B when the Contactor C is in the Off State>

Next, actions of the electric leakage detection when the electric leakage occurs in the high voltage battery B are described in the case that the contactor C is in the OFF state. In addition, although the illustration is omitted in FIG. 1, the ON or OFF state of the contactor C is controlled by a higher rank control unit (Battery Electronic Control Unit: Battery ECU). Moreover, the microcomputer 9 at low-voltage side of the electric leakage detecting apparatus A can recognize whether the contactor C is in the ON state or in the OFF state at that time by communicating with the higher rank control unit.

When the microcomputer 9 at low-voltage side recognizes that the contactor C is in the OFF state by communicating with the higher rank control unit, the microcomputer 9 at low-voltage side requests at first the first microcomputer 3 at high-voltage side to change the first switch 2 to the ON state. Here, in the case that the electric leakage occurs in the positive electrode side of the high voltage battery B (the positive electrode terminal of the cell module B3), when the first switch 2 is changed to the ON state, electric current flows in the path as shown in FIG. 3A. However, in the case that the electric leakage occurs in the negative electrode side of the high voltage battery B (the negative electrode terminal of the cell module B4), since the contactor C is in the OFF state, electric current does not flow in the path as shown in FIG. 5A.

Namely, when the first switch 2 is changed to the ON state in the case that the contactor C is in the OFF state, the input voltage V1 of the first microcomputer 3 at high-voltage side becomes higher ΔV1 than the voltage-divided value V1_M only if the electric leakage occurs in the positive electrode side of the high voltage battery B.

Next, the microcomputer 9 at low-voltage side requests the first microcomputer 3 at high-voltage side to change the first switch 2 to the OFF state, and then requests the second microcomputer 7 at high-voltage side to change the second switch 6 to the ON state. Here, in the case that the electric leakage occurs in the positive electrode side of the high voltage battery B, when the second switch 6 is changed to the ON state, since the contactor C is in the OFF state, electric current does not flow in the path as shown in FIG. 3B. However, in the case that the electric leakage occurs in the negative electrode side of the high voltage battery B, electric current flows in the path as shown in FIG. 5B.

Namely, when the second switch 6 is changed to the ON state in the case that the contactor C is in the OFF state, the input voltage V2 of the second microcomputer 7 at high-voltage side becomes lower ΔV2 than the voltage-divided value V2_M only if the electric leakage occurs in the negative electrode side of the high voltage battery B.

Therefore, when the digital data of the input voltage V1 which is outputted from the first microcomputer 3 at high-voltage side in the case that the first switch 2 is in the ON state and that the contactor C is in the OFF state is more than or equal to the first threshold value Vth1, the microcomputer 9 at low-voltage side judges that the electric leakage occurs in the positive electrode side of the high voltage battery B. Moreover, when the digital data of the input voltage V2 which is outputted from the second microcomputer 7 at high-voltage side in the case that the second switch 6 is ON and that the contactor C is in the OFF state is less than or equal to the second threshold value Vth2, the microcomputer 9 at low-voltage side judges that the electric leakage occurs in the negative electrode side of the high voltage battery B.

The electric leakage detecting apparatus A according to the above-mentioned embodiment is summarized as follows.

(a) An electric leakage detecting apparatus A which detects electric leakage of a high voltage battery B which includes a plurality of cell modules and is insulated from a chassis ground BG, the electric leakage detecting apparatus A comprises: a first cell module B1 which is any one of the plurality of cell modules and is in a positive electrode side; a second cell module B2 which is any one of the plurality of cell modules and is in a negative electrode side as compared with the first cell module B1; a first voltage-dividing circuit 1 which is parallely-connected to the first cell module B1; a second voltage-dividing circuit 5 which is parallely-connected to the second cell module B2; a ground connection resistance 10 whose one end is connected to the chassis ground BG; a first switch 2 which is inserted in a line connecting an output end of the first voltage-dividing circuit 1 and the other end of the ground connection resistance 10; a second switch 6 which is inserted in a line connecting an output end of the second voltage-dividing circuit 5 and the other end of the ground connection resistance 10; a first microcomputer 3 at high-voltage side (first voltage detecting circuit) which detects an output voltage of the first voltage-dividing circuit 1; a second microcomputer 7 at high-voltage side (second voltage detecting circuit) which detects an output voltage of the second voltage-dividing circuit 5; and a microcomputer 9 at low-voltage side (judging circuit) which judges whether the electric leakage of the high voltage battery B occurs or not on the basis of the output voltage of the first voltage-dividing circuit 1 which is detected by the first microcomputer 3 at high-voltage side (first voltage detecting circuit) in a case that the first switch 2 is in ON state and the output voltage of the second voltage-dividing circuit 5 which is detected by the second microcomputer 7 at high-voltage side (second voltage detecting circuit) in a case that the second switch 6 is in ON state.

(b) In addition, when both the output voltage of the first voltage-dividing circuit 1 which is detected by the first microcomputer 3 at high-voltage side (first voltage detecting circuit) in the case that the first switch 2 is in ON state and the output voltage of the second voltage-dividing circuit 5 which is detected by the second microcomputer 7 at high-voltage side (second voltage detecting circuit) in the case that the second switch 6 is in ON state are more than or equal to a first threshold value Vth1, the microcomputer 9 at low-voltage side (judging circuit) judges that the electric leakage occurs in the positive electrode side of the high voltage battery B.

(c) In addition, when both the output voltage of the first voltage-dividing circuit 1 which is detected by the first microcomputer 3 at high-voltage side (first voltage detecting circuit) in the case that the first switch 2 is in ON state and the output voltage of the second voltage-dividing circuit 5 which is detected by the second microcomputer 7 at high-voltage side (second voltage detecting circuit) in the case that the second switch 6 is in ON state are less than or equal to a second threshold value Vth2, the microcomputer 9 at low-voltage side (judging circuit) judges that the electric leakage occurs in the negative electrode side of the high voltage battery B.

(d) In addition, when one of the output voltage of the first voltage-dividing circuit 1 which is detected by the first microcomputer 3 at high-voltage side (first voltage detecting circuit) in the case that the first switch 2 is in ON state and the output voltage of the second voltage-dividing circuit 5 which is detected by the second microcomputer 7 at high-voltage side (second voltage detecting circuit) in the case that the second switch 6 is in ON state is more than or equal to the first threshold value Vth1 and the other is less than or equal to the second threshold value Vth2, the microcomputer 9 at low-voltage side (judging circuit) judges that the electric leakage occurs between the first cell module B1 and the second cell module B2.

(e) In addition, when the output voltage of the first voltage-dividing circuit 1 which is detected by the first microcomputer 3 at high-voltage side (first voltage detecting circuit) in the case that the first switch 2 is in ON state is equal to a voltage in a case that the first switch 2 is in OFF state and when the output voltage of the second voltage-dividing circuit 5 which is detected by the second microcomputer 7 at high-voltage side (second voltage detecting circuit) in the case that the second switch 6 is in ON state is more than or equal to the first threshold value Vth1, the microcomputer 9 at low-voltage side (judging circuit) judges that the electric leakage occurs in the first cell module B1.

(f) In addition, when the output voltage of the first voltage-dividing circuit 1 which is detected by the first microcomputer 3 at high-voltage side (first voltage detecting circuit) in the case that the first switch 2 is in ON state is less than or equal to the second threshold value Vth2 and when the output voltage of the second voltage-dividing circuit 5 which is detected by the second microcomputer 7 at high-voltage side (second voltage detecting circuit) in the case that the second switch 6 is in ON state is equal to a voltage in a case that the second switch 6 is in OFF state, the microcomputer 9 at low-voltage side (judging circuit) judges that the electric leakage occurs in the second cell module B2.

(g) In addition, the electric leakage detecting apparatus A may further comprise at least a contactor C between the first cell module B1 and the second cell module B2, wherein, when the contactor C is in OFF state, the microcomputer 9 at low-voltage side (judging circuit) judges whether the electric leakage of the high voltage battery B occurs or not on the basis of any one of the output voltage of the first voltage-dividing circuit 1 and the output voltage of the second voltage-dividing circuit 5.

As explained above, according to the embodiment, the conventional switching elements for high voltage which are expensive are unnecessary and the circuit structure can also be simplified. As a result, it is possible to detect the electric leakage of the high voltage battery B and to identify the electric leakage point of the high voltage battery B by low cost and the simple circuit structure.

Meanwhile, the invention is not limited only to the above-mentioned embodiment. The component of the above-mentioned embodiment may have various modifications without departing from the aspect of the invention.

(1) For example, in the above-mentioned embodiment, it was explained that the case where the microcomputers equipped with the A/D conversion function and the communication function were utilized as the first voltage detecting circuit which detects the output voltage of the first voltage-dividing circuit 1 and the second voltage detecting circuit which detects the output voltage of the second voltage-dividing circuit 5. However, for example, the component which utilizes the voltage detecting circuit of a flying capacitor method may be employed.

(2) In addition, in the above-mentioned embodiment, it was explained that the case where the switching elements (the first transistor 1a and the second transistor 5a) which reduce the current consumption of the high voltage battery B were provided to the first voltage-dividing circuit 1 and the second voltage-dividing circuit 5. However, the switching elements may be not always necessary to be equipped.

(3) In addition, in the above-mentioned embodiment, it was explained that the case where, in the four cell modules B1, B2, B3, and B4 which were equipped in the high voltage battery B, B1 was used as the first cell module and B2 was used as the second cell module. However, any of the cell modules may be used as the first cell module and the second cell module. For example, the first voltage-dividing circuit 1, the first switch 2, and the first microcomputer 3 at high-voltage side may be provided to B3 which is used as the first cell module, and the second voltage-dividing circuit 5, the second switch 6, and the second microcomputer 7 at high-voltage side may be provided to B2 (or B4) which is used as the second cell module. Moreover, the number of sets of the cell module is not limited to four sets, and the number of the contactor C is not limited to one.

INDUSTRIAL APPLICABILITY

According to the above-mentioned aspect of the present invention, it is possible to provide an electric leakage detecting apparatus which can detect the electric leakage of the high voltage battery by low cost and a simple circuit structure. Accordingly, the present invention has significant industrial applicability.

REFERENCE SIGNS LIST

A: ELECTRIC LEAKAGE DETECTING APPARATUS
B: HIGH VOLTAGE BATTERY
B1: FIRST CELL MODULE
B2: SECOND CELL MODULE
BG: CHASSIS GROUND
C: CONTACTOR
1: FIRST VOLTAGE-DIVIDING CIRCUIT
2: FIRST SWITCH
3: FIRST MICROCOMPUTER AT HIGH-VOLTAGE SIDE (FIRST VOLTAGE DETECTING CIRCUIT)
4: FIRST INSULATING ELEMENT
5: SECOND VOLTAGE-DIVIDING CIRCUIT
6: SECOND SWITCH
7: SECOND MICROCOMPUTER AT HIGH-VOLTAGE SIDE (SECOND VOLTAGE DETECTING CIRCUIT)
8: SECOND INSULATING ELEMENT
9: MICROCOMPUTER AT LOW-VOLTAGE SIDE (JUDGING CIRCUIT)
10: GROUND CONNECTION RESISTANCE

The invention claimed is:

1. An electric leakage detecting apparatus which detects electric leakage of a high voltage battery which includes a plurality of cell modules and is insulated from a chassis ground, the electric leakage detecting apparatus comprising:
a first cell module which is any one of the plurality of cell modules and is in a positive electrode side;
a second cell module which is any one of the plurality of cell modules and is in a negative electrode side as compared with the first cell module;
a first voltage-dividing circuit which is parallely-connected to the first cell module;
a second voltage-dividing circuit which is parallely-connected to the second cell module;
a ground connection resistance whose one end is connected to the chassis ground;
a first switch which is inserted in a line connecting an output end of the first voltage-dividing circuit and other end of the ground connection resistance;

a second switch which is inserted in a line connecting an output end of the second voltage-dividing circuit and the other end of the ground connection resistance;

a first voltage detecting circuit which detects an output voltage of the first voltage-dividing circuit;

a second voltage detecting circuit which detects an output voltage of the second voltage-dividing circuit; and a judging circuit which judges whether the electric leakage of the high voltage battery occurs or not on the basis of the output voltage of the first voltage-dividing circuit which is detected by the first voltage detecting circuit in a case that the first switch is in ON state and the output voltage of the second voltage-dividing circuit which is detected by the second voltage detecting circuit in a case that the second switch is in ON state.

2. The electric leakage detecting apparatus according to claim 1, wherein, when both the output voltage of the first voltage-dividing circuit which is detected by the first voltage detecting circuit in the case that the first switch is in ON state and the output voltage of the second voltage-dividing circuit which is detected by the second voltage detecting circuit in the case that the second switch is in ON state are more than or equal to a first threshold value, the judging circuit judges that the electric leakage occurs in the positive electrode side of the high voltage battery.

3. The electric leakage detecting apparatus according to claim 1, wherein, when both the output voltage of the first voltage-dividing circuit which is detected by the first voltage detecting circuit in the case that the first switch is in ON state and the output voltage of the second voltage-dividing circuit which is detected by the second voltage detecting circuit in the case that the second switch is in ON state are less than or equal to a second threshold value, the judging circuit judges that the electric leakage occurs in the negative electrode side of the high voltage battery.

4. The electric leakage detecting apparatus according to claim 1, wherein, when one of the output voltage of the first voltage-dividing circuit which is detected by the first voltage detecting circuit in the case that the first switch is in ON state and the output voltage of the second voltage-dividing circuit which is detected by the second voltage detecting circuit in the case that the second switch is in ON state is more than or equal to the first threshold value and other is less than or equal to the second threshold value, the judging circuit judges that the electric leakage occurs between the first cell module and the second cell module.

5. The electric leakage detecting apparatus according to claim 1, wherein, when the output voltage of the first voltage-dividing circuit which is detected by the first voltage detecting circuit in the case that the first switch is in ON state is equal to a voltage in a case that the first switch is in OFF state and when the output voltage of the second voltage-dividing circuit which is detected by the second voltage detecting circuit in the case that the second switch is in ON state is more than or equal to the first threshold value, the judging circuit judges that the electric leakage occurs in the first cell module.

6. The electric leakage detecting apparatus according to claim 1, wherein, when the output voltage of the first voltage-dividing circuit which is detected by the first voltage detecting circuit in the case that the first switch is in ON state is less than or equal to the second threshold value and when the output voltage of the second voltage-dividing circuit which is detected by the second voltage detecting circuit in the case that the second switch is in ON state is equal to a voltage in a case that the second switch is in OFF state, the judging circuit judges that the electric leakage occurs in the second cell module.

7. The electric leakage detecting apparatus according to claim 1 further comprises at least a contactor between the first cell module and the second cell module, wherein, when the contactor is in OFF state, the judging circuit judges whether the electric leakage of the high voltage battery occurs or not on the basis of any one of the output voltage of the first voltage-dividing circuit and the output voltage of the second voltage-dividing circuit.

* * * * *